(12) United States Patent
Boufounos

(10) Patent No.: US 8,219,360 B2
(45) Date of Patent: Jul. 10, 2012

(54) METHOD FOR RECONSTRUCTING SPARSE SIGNALS FROM SIGN MEASUREMENTS USING GREEDY SEARCH

(75) Inventor: Petros T. Boufounos, Boston, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 419 days.

(21) Appl. No.: 12/609,421

(22) Filed: Oct. 30, 2009

(65) Prior Publication Data

US 2011/0107164 A1    May 5, 2011

(51) Int. Cl.
*G06F 11/07* (2006.01)
(52) U.S. Cl. ...................................... 702/189

(58) Field of Classification Search .................. 702/189
See application file for complete search history.

(56) References Cited

OTHER PUBLICATIONS

Charles L. Byrne, Member, IEEE, Convergent Block-Iterative Algorithms for Image Reconstruction from Inconsistent Data, IEEE Transactions on Image Processing, vol. 6, No. 9, Sep. 1997, p. 1296-1304.*

\* cited by examiner

*Primary Examiner* — Tung S Lau
(74) *Attorney, Agent, or Firm* — Dirk Brinkman; Gene Vinokur

(57) ABSTRACT

A signal x is reconstructed from sparse sign measurements y. Estimated measurements $\tilde{y}$ are obtained from a previous estimate $\hat{x}^{l-1}$ and a measurement matrix $\Phi$ according to $\tilde{y}^l = \Phi \hat{x}^{l-1}$. A correction signal is applied to inconsistent measurements, so that consistent reconstruction can be performed.

6 Claims, 4 Drawing Sheets

Inputs: Measurement signs $y \in \{\pm 1\}^N$, Measurement matrix $\Phi$, Signal sparsity $K$.
Initialization: Iteration count $l = 0$, Initial $K$-sparse estimate $\widehat{x}^0$ 1: while not converged do
2:    *Increase iteration count:*
$$l \leftarrow l + 1$$
3:    *Compute measurements estimate:*
$$\widetilde{y}^l = \text{diag}(y) \Phi \widehat{x}^{l-1},$$
where $\text{diag}(y)$ is a diagonal matrix with the measured signs. Consistency is achieved when $\widetilde{y}$ has positive elements.
4:    *Identify sign consistencies:*
$$r^l = (\widetilde{y}^l)^-,$$
where the function $(\cdot)^-$ is the element-wise negative part of a vector (i.e., sets all the positive elements to 0).
5:    *Compute correction signal:*
$$s^l = \Phi^T \text{diag}(y) r^l$$
6:    *Identify correction support:*
$$T^l = \text{supp}(s^l|_{2K}) \cup \text{supp}(\widehat{x}^{l-1}),$$
where $\text{supp}(\cdot)$ determines the support set of a vector, and $x|_K$ selects the $K$ components of $x$ with the largest magnitude, setting all others to 0.
7:    *Perform Consistent Reconstruction over chosen support:*
$$b^l|_T = \arg\min_x \left\| \left( \text{diag}(y) \Phi x \right)^- \right\|_2^2, \text{ s.t. } \|x\|_2 = 1 \text{ and } x|_{T^c} = 0$$
i.e., minimize the squared norm of the negative (inconsistent) part of the vector subject to the normalization constraint. The optimization is only over the support $T$. Details for this (also non-convex) optimization are presented in the paper.
8:    *Truncate, normalize, and update the estimate:*
$$\widehat{x}^l = \frac{b^l|_K}{\|b^l|_K\|_2}$$

Output: $\widehat{x}^l$

*Fig. 1*

$$\underbrace{y}_{300} = \underbrace{\begin{bmatrix} 1 & 0 & 0 \\ 0 & 1 & 0 \\ 0 & 0 & 1 \end{bmatrix}}_{301} \underbrace{[\Phi]}_{302} \underbrace{[\hat{x}^0]}_{303}$$

*Fig. 3*

$$\tilde{y} = \Phi \hat{x}^0$$

METHOD FOR RECONSTRUCTING SPARSE SIGNALS FROM SIGN MEASUREMENTS USING GREEDY SEARCH

FIELD OF THE INVENTION

This invention is generally related to reconstructing sparse signals, and in particular to reconstructing sparse signals from signs of signal measurements.

BACKGROUND OF THE INVENTION

To represent an arbitrary signal without error, it is well known that a signal must be measured at a rate that is at least twice the highest frequency (Nyquist rate). However, it is known certain signals can be compressed after measuring. It has been shown that measuring such signals and then compressing the signals wastes resources. Instead, compressive sensing can be used to efficiently acquire and reconstruct signals that are sparse or compressible. Compressive sensing leverages the structure of the signals to enable measuring at rates significantly lower than the Nyquist rate. Compressive sensing can use randomized, linear, non-adaptive measurements, followed by non-linear reconstruction using convex optimization, specifically, $l_1$ norm minimization, or using greedy searches.

Digital measurements of signals are quantized to a finite number of bits. e.g., only the most significant (sign) bit. However, reconstruction a signal from one bit measurements is difficult. One method combines the principle of consistent reconstruction with $l_1$ norm minimization on a unit sphere to reconstruct the signal.

SUMMARY OF THE INVENTION

Embodiments of the invention provide a method for reconstructing quantized signals by combining a greedy search with consistent reconstruction. At each iteration, the greedy search selects a locally optimal value to eventually determine a global optimum.

The invention processes linear measurements of a signal vector x using inner products with rows of a measurement matrix $\Phi$. Each measurement is quantized to one sign bit in y.

$$y=\text{sign}(\Phi x), \quad (1)$$

where a function $\text{sign}(y_i)=y_i/|y_i|$ is applied element-wise to the measurements $\Phi x$, and the signal vector x is K-sparse, or compressible in a canonical basis. It is possible to embody the invention for signals that are sparse in another basis using x=Ba throughout the invention, where B is the matrix of the basis and a is the reconstructed vector of sparse coefficients that compose the signal using the basis matrix B.

The invention uses an iterative greedy search and consistent reconstruction, instead of $l_1$ norm minimization, as in the prior art. By combining the consistent reconstruction with the sparsity assumption, performance of the reconstruction of the spare signal can be significantly improved. The consistency is enforced with respect to the signs.

BRIEF DESCRIPTION OF THE DRAWINGS

FIG. 1 is a block diagram of pseudo code of method for reconstructing sparse signals from sign measurements according to embodiments of the invention;

FIGS. 3-4 are schematic of vector and matrix operations that can be used by the method of FIG. 1.

DETAILED DESCRIPTION OF THE PREFERRED EMBODIMENT

Figure 2:
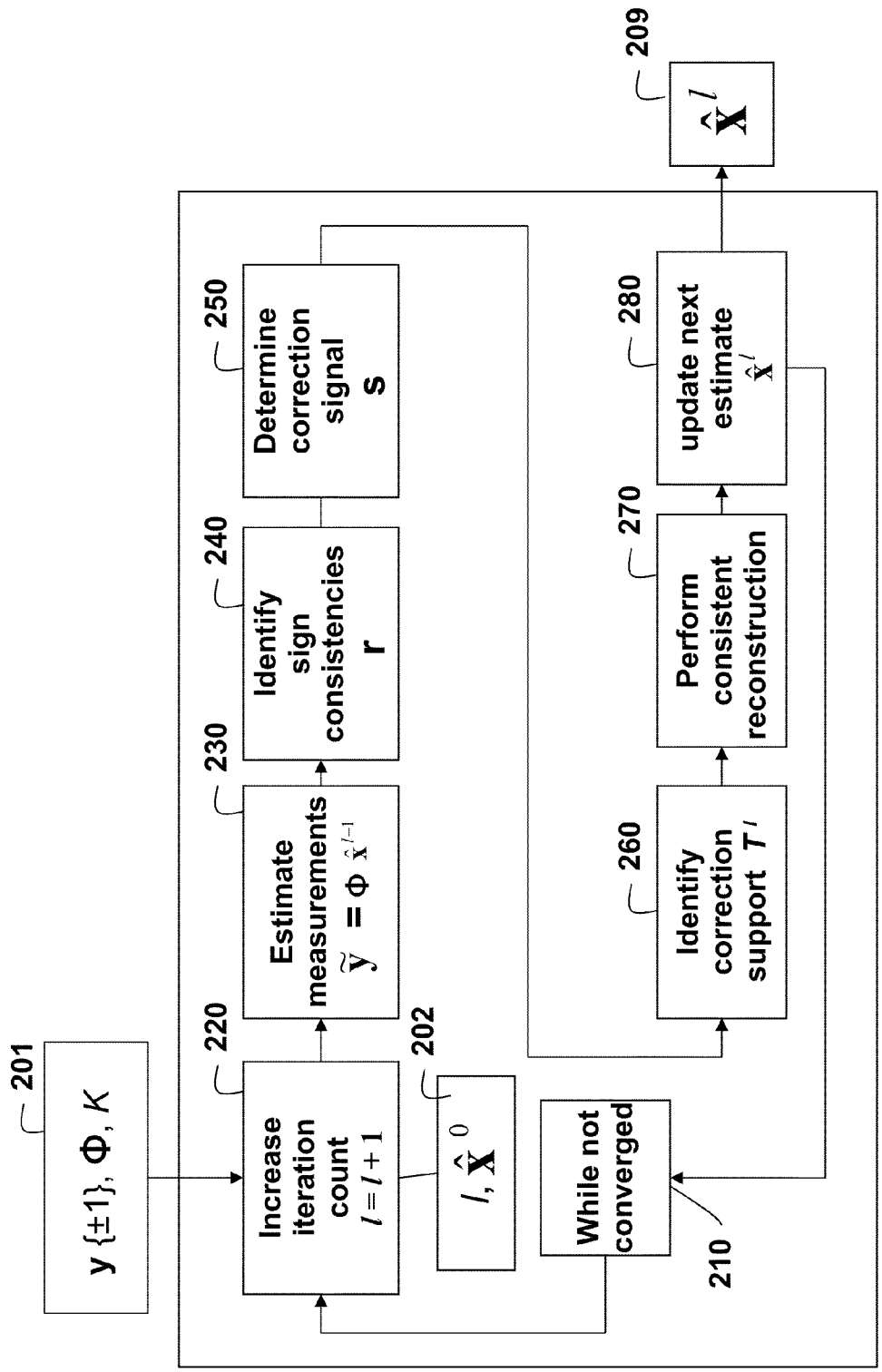
FIG. 2 is a block diagram of the method of FIG. 1.

As shown in FIGS. 1-4, the embodiments of the invention provide an iterative method for reconstructing a signal vector x. The vector x is K-sparse in a canonical basis. By convention, the variable K indicates a largest number of non-zero elements. The reconstruction enforces a $l_2$ (Euclidean) norm.

After each iteration l, the method produces a current estimate $\hat{x}^l$ of a reconstructed signal $\hat{x}$, and its sparse support. In particular, we consider linear measurements of the signal $x \in \mathfrak{R}^N$ using inner products with rows of a measurement matrix $\Phi \in \mathfrak{R}^{M \times N}$. Each measurement is quantized to one bit by retaining only the sign bit in a measurement vector y. The steps of the method can be performed in a processor 200 including memory and I/O interfaces as known in the art.

Inputs-201: measurement vector y {±1} 300 of signs of the signal measurements $\Phi x$ in a measurement matrix $\Phi$ 302, and a sparsity K.

Initialization 202: Iteration count l=0, and a current estimate $\hat{x}^0$ 303 of the reconstructed signal $\hat{x}$.

Step 1-210: While not converged do

Step 2-220: Increase iteration count l←l+1

Step 3-230: Estimate measurements $\tilde{y}$ using the estimate of the reconstructed signal $\hat{x}^{l-1}$ in the previous iteration.

In one embodiment, see FIG. 3, this is done according to $\tilde{y}=\text{diag}(y)\Phi\hat{x}^{l-1}$, where the function diag constructs a diagonal matrix 301 of the vector y. The estimated measurements are consistent when all elements of the measurements $\tilde{y}$ are positive.

Figure 4:
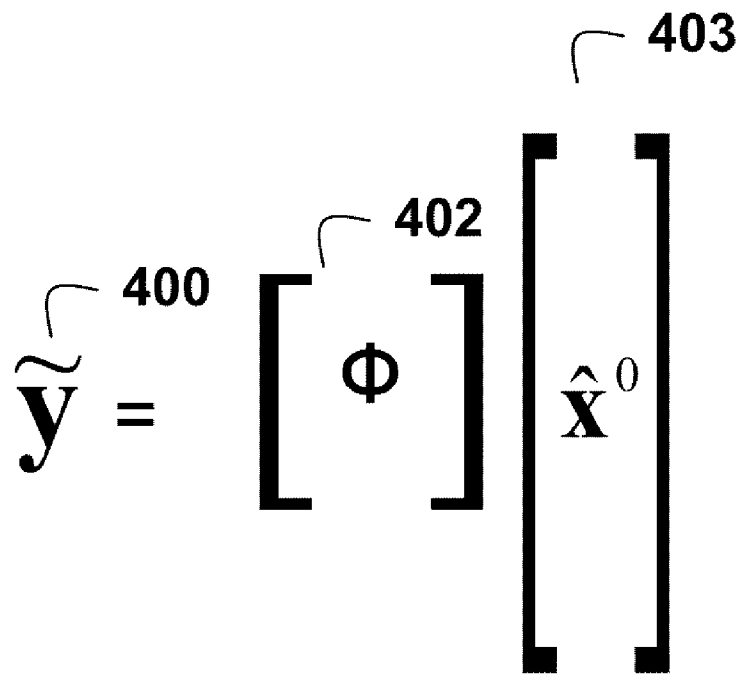

In a second embodiment, see FIG. 4, this is done according to $\tilde{y}=\Phi\hat{x}^{l-1}$. The estimated measurements are consistent when all elements of $\tilde{y}$ have the same sign as the corresponding elements of the vector y.

FIG. 3 shows a diagonal matrix diag(y) 301 that contains the signs in the measurement vector y on the diagonal, and the measurement matrix $\Phi$ 302. In one embodiment, the estimate is $\tilde{y}=\text{diag}(y)\Phi\hat{x}^{l-1}$. FIG. 4 shown the second embodiment, where the diagonal matrix 301 is omitted.

Step 4-240: Identify sign inconsistencies in a vector r for measurements in the vector y that have signs inconsistent with the estimated measurements $\tilde{y}$ 300, according to $r^l=(\tilde{y}^l)^-$.

In the embodiment as shown in FIG. 3, the vector r only stores the negative elements $(\tilde{y}^l)^-$ of the output of step 3, where $(.)^-$ indicates the negative elements of $\tilde{y}$, and all positive elements are set to zero.

In the second embodiment as shown in FIG. 4, the vector r stores the elements of the vector $\tilde{y}$ that have opposite signs than the corresponding elements in the vector y, and sets all the elements with the same sign to zero.

Step 5-250: Determine a correction signal s according to $s=\Phi^T \text{diag}(y)r$ if the diagonal matrix is used in step 3, and according to $s=\Phi^T r$ if the diagonal matrix is not used. The correction signal s is used to make the signs in the estimated measurements $\tilde{y}$ consistent.

Step 6-260: Identify support set for the correction signal s according to $$T=\text{supp}(s^l|_L) \cup \text{supp}(\hat{x}^{l-1}),$$

where supp(.) determines a support set, and $(.)|_L$ selects L components of the correction signal s with largest magnitudes, and sets all other components to 0. The size L is a parameter of the method depending on the properties of the measurement matrix $\Phi$. We prefer K<L≦2K. A smaller L can make the reconstruction much slower. A larger L can make the reconstruction less precise or reduce the probability that the method converges correctly.

Step 7-270: Perform consistent reconstruction on the support T using the following optimization:

$$b^l|_T = \arg\min_x \|(\text{diag}(y)\Phi x)^-\|_2^2, \text{ such that } \|x\|_2=1 \text{ and } x|_{T_c}=0,$$

and set $b^l|_{T_c}=0$, where $b^l$ is the result of the optimization, $b^l|_T$ denotes the elements of $b_l$ in the support set T, and $b^l|_{T_c}$ denotes elements not in the support set. The notation $\|\cdot^{108}\|_2$ denotes the $l_2$ norm, i.e., a total signal energy, and $\|\cdot\|_2^2$ denotes a square of the $l_2$ norm.

That is, the squared norm of the inconsistent part of the vector, subject to the normalization constraint, is minimized. The minimization can also be performed on the inconsistent part of the non-diagonal form $\Phi x$, similarly to the embodiment in FIG. 4.

Step 8-280: Truncate, normalize, and update correction according to $$\hat{x}^l = \frac{b^l|_K}{\|b^l|_K\|_2}.$$

Output-209: Reconstructed signal $\hat{x}^l$.

Measurement Process

The measurement process only records the sign of measurement $\text{sign}(\Phi x)=\text{sign}(\Phi \alpha x)$, for all $\alpha>0$, and discards the magnitude. Therefore, the amplitude constraint $\|\hat{x}\|_2=1$ is imposed during the reconstruction, otherwise $x=0$ would be a consistent but undesirable solution. This is why the $l_2$ norm constraint is enforced by normalizing the signal after each iteration.

However, other methods and constraints can be used to normalize the signal. Examples include but are not limited to: normalizing the signal to have a pre-specified $l_1$ norm, normalizing the signal to have a pre-specified $l_\infty$ norm, scaling the signal such that a particular coefficient or a linear combination of the coefficients has a pre-specified value, or projecting the signal to a pre-specified plane.

EFFECT OF THE INVENTION

The invention provides a method for reconstructing sparse and compressible signals from signs of measurement of the signals, while enforcing a sign consistency constraint and a norm constraint. The method is greedy by selecting a local optimum at each iteration. The reconstruction method has several advantages over the prior art, which uses an $l_1$ norm minimization-based consistent reconstruction.

If the signal estimate $\hat{x}$ during the iterations becomes equal to the measured signal x, then the method is guaranteed to terminate with the correct solution. This is in contrast to the prior art, which provides no such guarantee.

Second, in contrast to prior art, the reconstruction always returns a sparse solution.

Third, in contrast to the prior art, the method does not rely on the $l_1$ norm to measure the sparsity of the reconstructed signal. Thus, the method can use the $l_1$ norm as a normalization constraint, instead of the $l_2$ norm. It is possible to modify the method so that the solution satisfies $\|\hat{x}\|_1=1$.

Fourth, the method is more consistent and has better performance than the $l_1$ norm based method of the prior art.

The method significantly outperforms prior art methods that do not enforce sparsity and a norm constraint. At high bit rates, the gain can be 12 dB to 20 dB when compared to prior art reconstruction.

Although the invention has been described by way of examples of preferred embodiments, it is to be understood that various other adaptations and modifications can be made within the spirit and scope of the invention. Therefore, it is the object of the appended claims to cover all such variations and modifications as come within the true spirit and scope of the invention.

I claim:

1. A method for reconstructing a signal x from sign measurements y, wherein $\hat{x}^l$ is a current estimate of the reconstructed signal x, comprising for each iteration l, until the current estimate convergences with a previous estimate $\hat{x}^{l-1}$, the steps of:

estimating measurements $\tilde{y}$ using the previous estimate $\hat{x}^{l-1}$ and a measurement matrix $\Phi$ according to $\tilde{y}^l=\Phi\hat{x}^{l-1}$;

identifying, in a vector r, sign measurements y that have signs inconsistent with the estimated measurements $\tilde{y}$;

determining a correction signal according to $s=\Phi^T r^l$;

identifying a support set $T^l$ for the correction signal s according to $$T^l=\text{supp}(s^l|_{2K}) \cup \text{supp}(\hat{x}^{l-1}),$$

where supp(.) determines the support set $T^l$, and $(.)|_{2K}$ selects 2K components of the signal x with largest magnitudes, and setting all other components of the signal x to 0;

performing consistent reconstruction according to $b^l|_T=\arg\min_x\|\Phi x\|_2^2$, such that $\|x\|2=1$, and $x|_{T_c}=0$, wherein $|_T$ denotes elements in the support set and $|_{T_c}$ denotes elements not in the support set; and updating the current estimate $\hat{x}^l$, wherein the estimating, identifying, determining, identifying, performing, and updating steps are performed in a computer system, wherein the steps are performed in a processor.

2. The method of claim 1, wherein the signal x is K-sparse in any basis.

3. The method of claim 1, wherein the signal x is compressible.

4. The method of claim 1, wherein the reconstruction enforces a $l_2$ norm.

5. The method of claim 1, wherein the estimating step uses $\tilde{y}^l=\text{diag}(y)\Phi\hat{x}^{l-1}$, wherein the function diag constructs a diagonal matrix of the sign measurements y; and the determining step uses $S=\Phi^T \text{diag}(y)r$.

6. The method of claim 1, wherein the identifying step retains only negative elements $(\tilde{y}^l)^{-1}$, and further comprising: setting all positive elements to zero.

* * * * *